(12) United States Patent
Yug

(10) Patent No.: US 11,094,892 B2
(45) Date of Patent: Aug. 17, 2021

(54) DISPLAY DEVICE AND METHOD OF MANUFACTURING THE SAME

(71) Applicant: Samsung Display Co., Ltd., Yongin-si (KR)

(72) Inventor: Geunwoo Yug, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/803,248

(22) Filed: Feb. 27, 2020

(65) Prior Publication Data

US 2020/0194696 A1 Jun. 18, 2020

Related U.S. Application Data

(62) Division of application No. 16/195,639, filed on Nov. 19, 2018, now Pat. No. 10,608,192.

(30) Foreign Application Priority Data

Nov. 23, 2017 (KR) .......................... 10-2017-0156924

(51) Int. Cl.
*H01L 51/00* (2006.01)
*H01L 51/52* (2006.01)
(Continued)

(52) U.S. Cl.
CPC ...... *H01L 51/0096* (2013.01); *H01L 51/0027* (2013.01); *H01L 51/5253* (2013.01);
(Continued)

(58) Field of Classification Search
CPC ............. H01L 51/0096; H01L 51/0027; H01L 51/5253; H01L 51/56; H01L 51/5281;
(Continued)

(56) References Cited

U.S. PATENT DOCUMENTS

2013/0169515 A1* 7/2013 Prushinskiy .......... H01L 51/525
345/55
2014/0191268 A1 7/2014 Ebisawa et al.
(Continued)

FOREIGN PATENT DOCUMENTS

JP 5821155 B2 11/2015
KR 10-0699247 B1 3/2007
(Continued)

*Primary Examiner* — Mark W Tornow
(74) *Attorney, Agent, or Firm* — Lewis Roca Rothgerber Christie LLP

(57) ABSTRACT

A display device in which damage and carbonization of a display substrate is substantially minimized and a method of manufacturing the display device are provided. A display device includes: a substrate including a first area having a first thickness and a second area having a second thickness which is different from the first thickness; a display layer at the first area of the substrate; and a functional member on the display layer at the first area. The first area and the second area are arranged along a first direction, the substrate includes a protruding portion at the second area, and the protruding portion includes a side portion having an inclination of about 5 degrees or more with respect to the first direction toward a second direction which intersects the first direction.

8 Claims, 11 Drawing Sheets

(51) Int. Cl.
*H01L 51/56* (2006.01)
*H01L 27/32* (2006.01)

(52) U.S. Cl.
CPC ............ *H01L 51/56* (2013.01); *H01L 27/323* (2013.01); *H01L 27/3244* (2013.01); *H01L 51/5281* (2013.01); *H01L 2227/323* (2013.01); *H01L 2251/566* (2013.01)

(58) Field of Classification Search
CPC ............... H01L 27/323; H01L 27/3244; H01L 2227/323; H01L 2251/566
See application file for complete search history.

(56) References Cited

U.S. PATENT DOCUMENTS

| | | | |
|---|---|---|---|
| 2015/0146386 A1* | 5/2015 | Namkung | ......... G02F 1/133305 361/749 |
| 2017/0358772 A1* | 12/2017 | Sung | ................... H01L 27/3258 |
| 2018/0135809 A1 | 5/2018 | Kim et al. | |
| 2018/0151644 A1* | 5/2018 | Han | ..................... G09G 3/3225 |
| 2019/0259924 A1 | 8/2019 | Ho et al. | |
| 2019/0288168 A1 | 9/2019 | Kong | |

FOREIGN PATENT DOCUMENTS

| | | |
|---|---|---|
| KR | 10-1290519 B1 | 7/2013 |
| KR | 2014-0064366 A | 5/2014 |
| KR | 10-1425492 B1 | 8/2014 |
| KR | 10-2015-0045076 A | 4/2015 |

\* cited by examiner

DISPLAY DEVICE AND METHOD OF MANUFACTURING THE SAME

CROSS-REFERENCE TO RELATED APPLICATIONS

This application is a divisional of U.S. patent application Ser. No. 16/195,639, filed on Nov. 19, 2018, which claims priority to and the benefit of Korean Patent Application No. 10-2017-0156924, filed on Nov. 23, 2017 in the Korean Intellectual Property Office, the entire disclosure of each of which is incorporated by reference herein.

1. FIELD

Aspects of embodiments of the present invention relate to a display device and a method of manufacturing the display device.

2. DISCUSSION OF RELATED ART

Display devices include a plurality of pixels provided in an area defined by a black matrix or a pixel defining layer. Examples of the display device may include liquid crystal display (LCD) devices, light emitting element display devices, electrophoretic display devices, and the like.

It is to be understood that this background of the technology section is intended to provide useful background for understanding the technology and as such disclosed herein, the technology background section may include ideas, concepts, or recognitions that were not part of what was known or appreciated by those skilled in the pertinent art prior to a corresponding effective filing date of subject matter disclosed herein.

SUMMARY

According to aspects of embodiments of the present invention, a display device capable of substantially minimizing damage and carbonization of a display substrate and a method of manufacturing the display device are provided.

According to one or more exemplary embodiments, a display device includes: a substrate including a first area having a first thickness and a second area having a second thickness which is different from the first thickness; a display layer at the first area of the substrate; and a functional member on the display layer at the first area. The first area and the second area are arranged along a first direction, the substrate includes a protruding portion at the second area, and the protruding portion includes a side portion having an inclination of about 5 degrees or more with respect to the first direction toward a second direction which intersects the first direction.

The substrate may have a groove at the second area.

The substrate may include an upper surface on which the display layer is located and a lower surface opposite the upper surface, and the groove may be located at the upper surface.

The substrate may include a base layer and a protective layer, and the base layer may be located closer to the display layer than the protective layer is to the display layer.

The functional member may include at least one of a polarizer and a touch screen panel.

The polarizer may include a protective layer and a polarization layer, and the polarization layer may be positioned between the protective layer and the substrate at the first area.

According to one or more exemplary embodiments, a display device includes: a substrate including a first area having a first thickness, a second area having a second thickness which is different from the first thickness, and a third area having a third thickness which is different from the first and second thicknesses; a display layer at the first area of the substrate; and a functional member on the display layer at the first area. The first, second, and third areas are arranged along a first direction, the substrate includes a protruding portion at the second area, and the protruding portion includes at least one side portion having an inclination of about 5 degrees or more with respect to the first direction toward a second direction which intersects the first direction.

The substrate may have a groove at the second area.

The substrate may include an upper surface on which the display layer is located and a lower surface opposite the upper surface, and the groove may be located at the upper surface.

The substrate may include a base layer and a protective layer, and the base layer may be located closer to the display layer than the protective layer is to the display layer.

The functional member may include at least one of a polarizer and a touch screen panel.

The polarizer may include a protective layer and a polarization layer, and the polarization layer may be positioned between the protective layer and the substrate at the first area.

According to one or more exemplary embodiments, a method of manufacturing a display device includes: preparing a mother substrate including a first area and a second area which are sequentially located along a first direction; forming a display layer at the first area of the mother substrate; forming a functional member at the first area so as to overlap with the display layer; irradiating a first laser beam in the first direction along a first cutting line of the first area; irradiating a second laser beam in a second direction which is from the second area toward the first area along a second cutting line of the first area; and irradiating a third laser beam in the first direction at the first area and the second area along a third cutting line of the first area and the second area. The first laser beam has an intensity greater than an intensity of the second laser beam and an intensity of the third laser beam, the intensity of the second laser beam is greater than the intensity of the third laser beam, and the second cutting line overlaps with at least a part of the first cutting line and at least a part of the third cutting line at the first area.

The display device may have a first thickness at the first area and a second thickness which is less than the first thickness at the second area.

The first cutting line may overlap with at least a part of the third cutting line at the first area.

The mother substrate may further include a third area. The method may further include, after irradiating the third laser beam in the first direction at the first area, the second area, and the third area along the third cutting line of the first area, the second area, and the third area: irradiating a fourth laser beam in the second direction at the third area along a fourth cutting line of the third area; and irradiating a fifth laser beam in the first direction at the third area along a fifth cutting line of the third area. The fourth laser beam may have an intensity greater than an intensity of the third laser beam and less than an intensity of the fifth laser beam, the fifth laser beam may have an intensity greater than the intensities of the second laser beam and the fourth laser beam, and the fourth cutting line may overlap with at least a part of the third cutting line and at least a part of the fifth cutting line.

The display device may have a first thickness at the first area, a second thickness which is less than the first thickness at the second area, and a third thickness which is less than the first thickness and larger than the second thickness at the third area.

At least a part of the first cutting line may overlap with at least a part of the second cutting line and at least a part of the third cutting line at the first area.

At least a part of the third cutting line may overlap with the first cutting line at the first area, and another part of the third cutting line may overlap with the fifth cutting line at the third area.

The mother substrate may have a groove at the second area.

The foregoing is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the present invention will become more apparent by describing in further detail some exemplary embodiments thereof with reference to the accompanying drawings, wherein.

DETAILED DESCRIPTION

Figure 1:
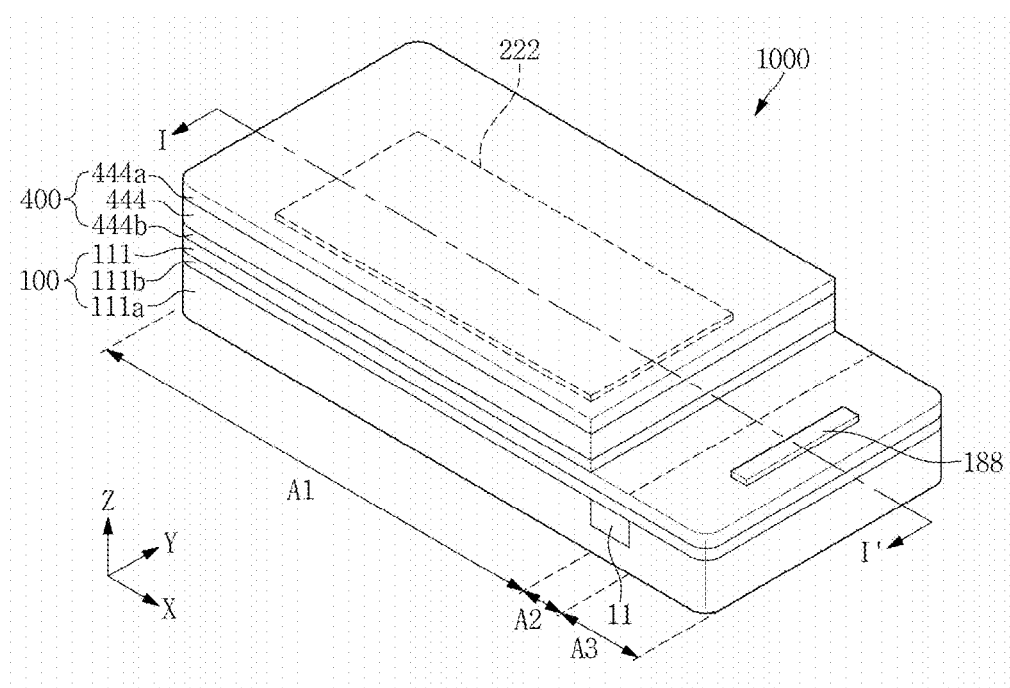
FIG. 1 is a perspective view illustrating a display device according to an exemplary embodiment.

Some exemplary embodiments will now be described more fully herein with reference to the accompanying drawings. Although the invention may be modified in various manners and have several exemplary embodiments, some exemplary embodiments are illustrated in the accompanying drawings and will be mainly described in the specification. However, the scope of the invention is not limited to the exemplary embodiments and should be construed as including all changes, equivalents, and substitutions included within the spirit and scope of the invention.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates may be absent therebetween. Further, when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper," and the like, may be used herein for ease of description to describe the relations between one element or component and another element or component as illustrated in the drawings. It is to be understood that the spatially relative terms are intended to encompass different orientations of the device in use or operation, in addition to the orientation depicted in the drawings. For example, in a case in which a device illustrated in the drawing is turned over, the device positioned "below" or "beneath" another device may be placed "above" another device. Accordingly, the illustrative term "below" may include both the lower and upper positions. The device may also be oriented in another direction and, thus, the spatially relative terms may be interpreted differently depending on the orientations.

Throughout the specification, when an element is referred to as being "connected" to another element, the element may be "directly connected" to the other element, or "electrically connected" to the other element with one or more intervening elements interposed therebetween. It is to be further understood that the terms "comprises," "including," "includes," and/or "including," when used in this specification, specify the presence of stated features, integers, steps, operations, elements, and/or components, but do not preclude the presence or addition of one or more other features, integers, steps, operations, elements, components, and/or groups thereof.

It is to be understood that, although the terms "first," "second," "third," and the like may be used herein to describe various elements, these elements should not be limited by these terms. These terms are used to distinguish one element from another element. Thus, a "first" element discussed below could be termed a "second" element or a "third" element, and a "second" element and a "third" element may be termed likewise without departing from the teachings herein.

"About" or "approximately," as used herein, are inclusive of the stated value and mean within an acceptable range of deviation for the particular value as determined by one of ordinary skill in the art, considering the measurement in question and the error associated with measurement of the particular quantity (i.e. the limitations of the measurement system). For example, "about" may mean within one or more standard deviations, or within ±30%, 20%, 10%, or 5% of the stated value.

Unless otherwise defined, all terms used herein (including technical and scientific terms) have the same meaning as commonly understood by those skilled in the art to which this invention pertains. It is to be further understood that terms, such as those defined in commonly used dictionaries, should be interpreted as having a meaning that is consistent with their meaning in the context of the relevant art and are not to be interpreted in an idealized or excessively formal sense unless clearly defined in the present specification.

Some of the parts which are not associated with the exemplary embodiments may not be described for purposes of clarity. Like reference numerals refer to like elements throughout the specification.

Herein, a display device and a method of manufacturing the display device according to an exemplary embodiment will be described in further detail with reference to FIGS. 1 to 18.

Figure 2:
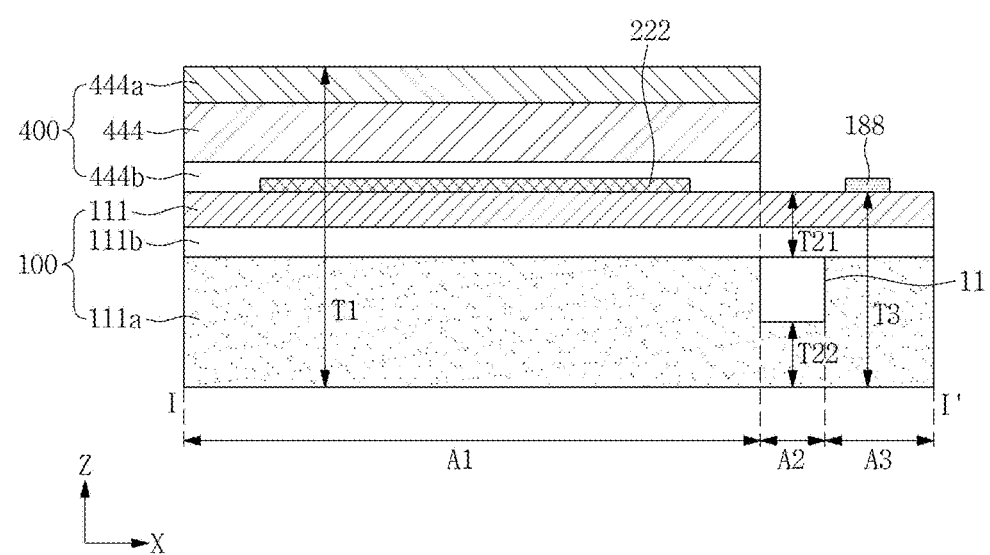
FIG. 2 is a cross-sectional view taken along the line I-I' of FIG. 1.
Figure 3:
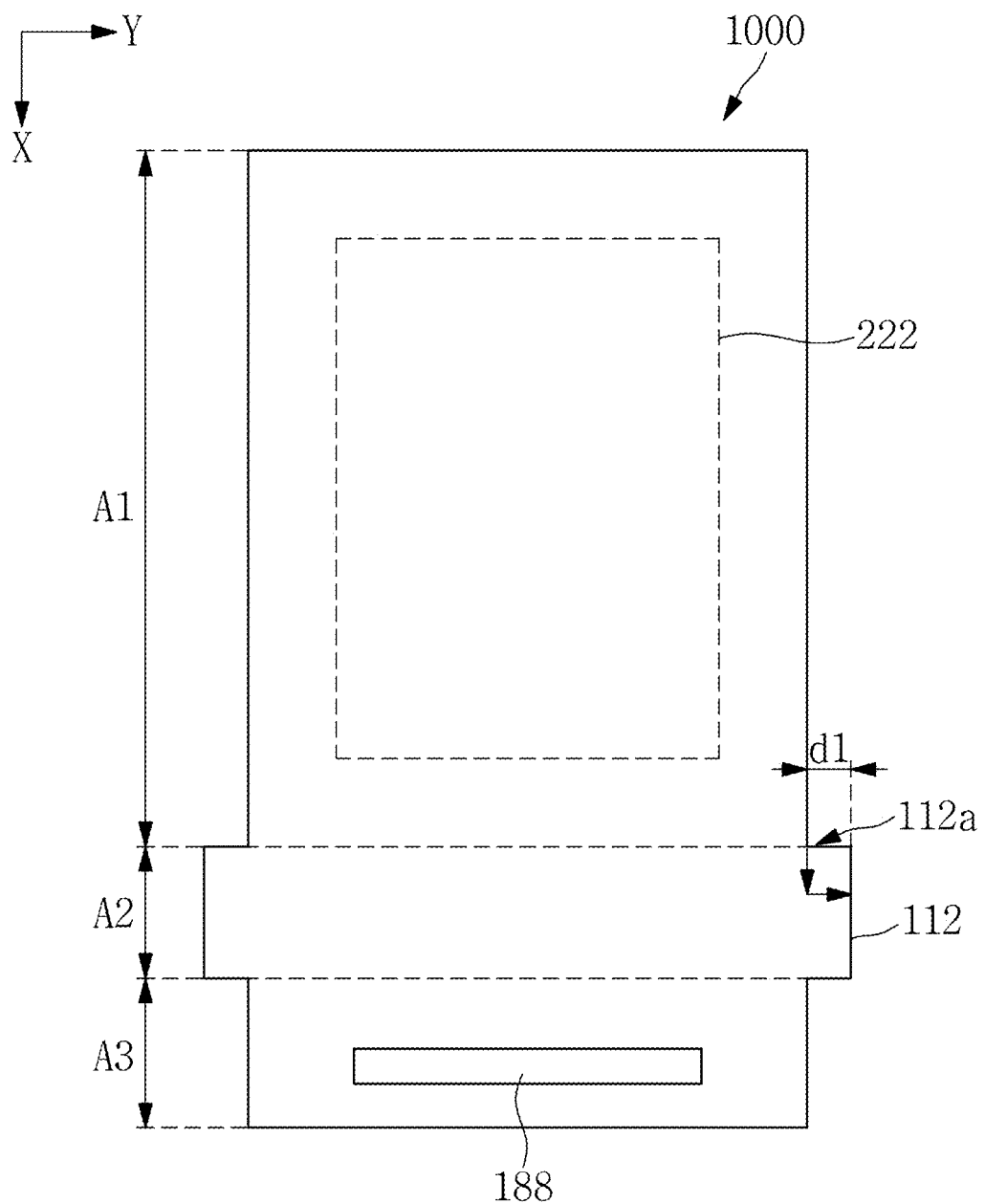
FIG. 3 is a plan view illustrating the display device according to an exemplary embodiment.

FIG. 1 is a perspective view illustrating a display device according to an exemplary embodiment; FIG. 2 is a cross-sectional view taken along the line I-I' of FIG. 1; and FIG. 3 is a plan view illustrating the display device according to an exemplary embodiment.

A display device 1000 according to an exemplary embodiment may include a substrate 100, a display layer 222, a polarizer 400, and a driver 188, as illustrated in FIG. 1.

The substrate 100 may include at least one layer disposed along a direction parallel to a Z-axis (herein, a Z-axis direction). For example, as illustrated in FIG. 1, the substrate 100 may include a protective layer 111a (herein, a first protective layer), an adhesive layer 111b (herein, a first adhesive layer), and a base layer 111 stacked in the Z-axis direction. The Z-axis is a direction which intersects an X-axis and a Y-axis. In an embodiment, for example, the Z-axis intersects the X-axis and the Y-axis perpendicularly.

The first protective layer 111a of the substrate 100 is positioned below the base layer 111 in the Z-axis direction. The first protective layer 111a may have a groove 11, as illustrated in FIGS. 1 and 2. For example, the first protective layer 111a may include an upper surface which is adjacent to the first adhesive layer 111b and a lower surface which faces the upper surface. The groove 11 is located at the upper surface of the first protective layer 111a. The groove 11 is located at a second area A2 of the substrate 100 to be described below.

In an embodiment, the first protective layer 111a may include polyethylene terephthalate (PET) or a material including PET.

The first adhesive layer 111b is positioned between the first protective layer 111a and the base layer 111. The first adhesive layer 111b attaches the base layer 111 and the first protective layer 111a to each other.

In an embodiment, the first adhesive layer 111b may include acryl or a material including acryl.

The base layer 111 is positioned on the first adhesive layer 111b. The base layer 111 includes an upper surface and a lower surface which are disposed in the Z-axis direction and face each other. The upper surface of the base layer 111 is adjacent to the display layer 222, and the lower surface of the base layer 111 is adjacent to the first adhesive layer 111b.

The base layer 111 may be a transparent insulating layer including a glass or a transparent plastic. In an embodiment, for example, the base layer 111 may include any selected from the group consisting of: kapton, polyether sulfone (PES), polycarbonate (PC), polyimide (PI), polyethylene terephthalate (PET), polyethylene naphthalate (PEN), polyacrylate (PAR), fiber reinforced plastic (FRP), and the like.

According to an exemplary embodiment, the substrate 100 may have a first area A1, the second area A2, and a third area A3 disposed along a direction parallel to the X-axis (herein, the X-axis direction). That is, an X-Y plane of the substrate 100 may have the first area A1, the second area A2, and the third area A3.

As illustrated in FIGS. 1 and 2, the first area A1 is a non-pad area and the non-pad area may have a display area and a non-display area. The display layer 222 and the polarizer 400 are located at the first area A1 of the substrate 100.

The display layer 222 is positioned between the substrate 100 and the polarizer 400. The display layer 222 includes a plurality of pixels, and each pixel includes a light emitting element and a pixel circuit portion for driving the light emitting element.

As illustrated in FIGS. 1 and 2, the polarizer 400, which serves as a functional member, is located at the first area A1 of the substrate 100. The polarizer 400 is positioned on the substrate 100 in the Z-axis direction. In an embodiment, the polarizer 400 may include an adhesive layer 444b (herein, a second adhesive layer), a polarization layer 444 and a protective layer 444a (herein, a second protective layer) stacked along the Z-axis direction.

The second adhesive layer 444b is positioned between the substrate 100 and the polarization layer 444 at the first area A1. For example, the second adhesive layer 444b is positioned between the base layer 111 and the polarization layer 444 at the first area A1.

The polarization layer 444 is positioned between the second adhesive layer 444b and the second protective layer 444a.

The second area A2 and the third area A3 of the substrate 100 are pad areas. The groove 11 is located at the upper surface of the first protective layer 111a in the second area A2, and the driver 188 which drives a pixel of the display layer 222 and includes a driving integrated circuit is located on the base layer 111 in the third area A3.

Referring to FIG. 2, the display device 1000 may have a first thickness T1 at the first area A1, may have a second thickness T21+T22 at the second area A2, and may have a third thickness T3 at the third area A3. In an embodiment, the first, second, and third thicknesses T1, T21+T22, and T3 have different values from each other. In an embodiment, the display device 1000 has the first thickness T1 including the substrate 100 and the polarizer 400 at the first area A1, has the second thickness T21+T22 including the substrate 100 having the groove 11 at the second area A2, and has the third thickness T3 including the substrate 100 at the third area A3. Accordingly, the first thickness T1 may be larger than the second and third thicknesses T21+T22 and T3, and the second thickness T21+T22 may be less than the third thickness T3.

Referring to FIG. 3, the substrate 100 may include a protruding portion 112 at the second area A2. The protruding portion 112 protrudes along a direction parallel to the Y-axis (herein, a Y-axis direction) on a plane at the second area A2. In such an exemplary embodiment, the protruding portion 112 may have a length d1 of about 10 μm or more. Accordingly, a side portion 112a of the protruding portion 112 may extend parallel to the Y-axis at a boundary between the first area A1 and the second area A2. Further, in an embodiment, the side portion 112a of the protruding portion 112 may extend to be slightly inclined with respect to the Y-axis. For example, when protruding by about 10 μm in the Y-axis direction, the side portion 112a of the protruding portion 112 may be inclined by about 2 μm in the X-axis direction. Accordingly, the side portion 112a of the protruding portion 112 may have an inclination of about 5 degrees or more in the Y-axis direction with respect to the X-axis direction.

Figure 4:
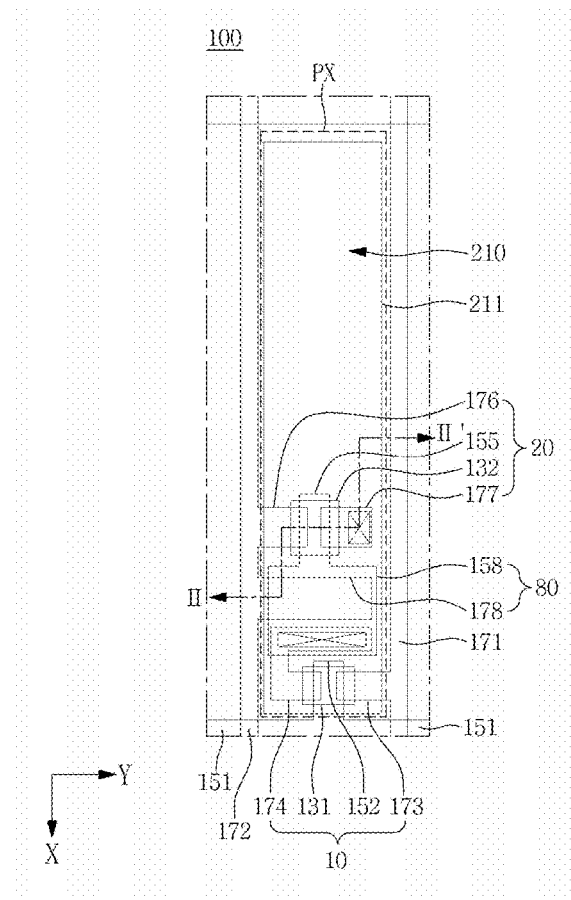
FIG. 4 is a plan view illustrating a pixel included in a display layer of the display device of FIG. 1.
Figure 5:
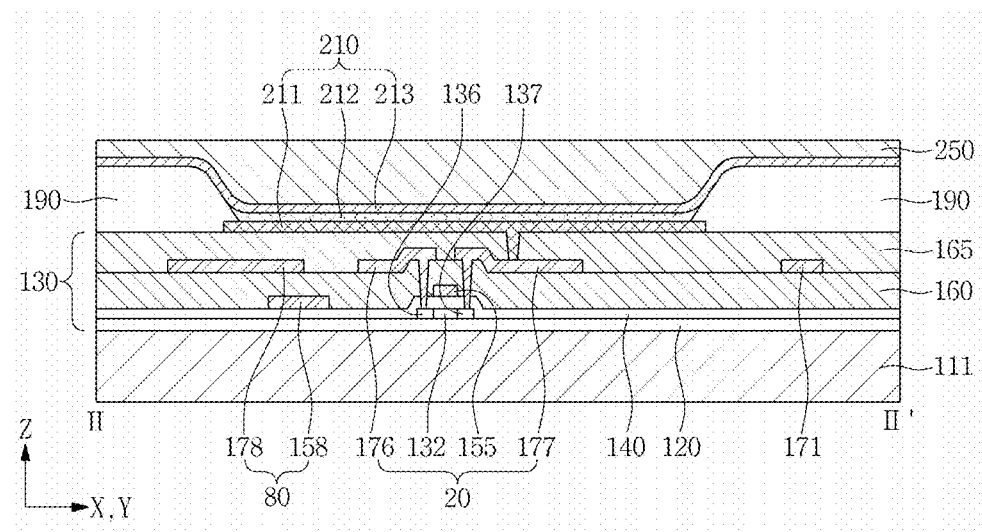
FIG. 5 is a cross-sectional view taken along the line II-II' of FIG. 4.

FIG. 4 is a plan view illustrating a pixel included in the display layer of the display device of FIG. 1; and FIG. 5 is a cross-sectional view taken along the line II-II' of FIG. 4.

A pixel PX includes a light emitting element 210 and a pixel circuit portion 130, as illustrated in FIGS. 4 and 5.

The pixel circuit portion 130 includes a switching thin film transistor 10, a driving thin film transistor 20, and a capacitor 80.

The pixel PX may be located at an area (a pixel area) defined by a gate line 151, a data line 171, and a common power line 172.

The light emitting element 210 may include a pixel electrode 211, a light emitting layer 212, and a common electrode 213. In an embodiment, the light emitting element 210 may be an organic light emitting element.

The pixel circuit portion 130 is located on the base layer 111 of the substrate 100. In other words, the switching thin film transistor 10, the driving thin film transistor 20, and the capacitor 80 are located on the base layer 111. The pixel circuit portion 130 drives the light emitting layer 212 of the light emitting element 210.

However, although structures of the pixel circuit portion 130 and the light emitting element 210 are illustrated in FIGS. 4 and 5, exemplary embodiments are not limited to the structures illustrated in FIGS. 4 and 5. The pixel circuit portion 130 and the light emitting element 210 may be formed in various structures within a range that may easily be modified by those skilled in the art.

Although it is shown in FIG. 4 that each pixel PX includes two thin film transistors and one capacitor, exemplary embodiments are not limited thereto. Each pixel PX may include three or more thin film transistors and two or more capacitors and may further include additional wirings to have any of various structures.

The pixel PX refers to a minimum unit for displaying images and may be any of a red pixel for emitting red light, a green pixel for emitting green light, and a blue pixel for emitting blue light.

In an embodiment, the base layer 111 may be a transparent insulating layer including a glass or a transparent plastic. In an embodiment, for example, the base layer 111 may include any selected from the group consisting of: kapton, polyether sulfone (PES), polycarbonate (PC), polyimide (PI), polyethylene terephthalate (PET), polyethylene naphthalate (PEN), polyacrylate (PAR), fiber reinforced plastic (FRP), and the like.

A buffer layer 120 may be disposed on the base layer 111. The buffer layer 120 serves to substantially prevent permeation of undesirable elements and to planarize a surface therebelow and may include any of suitable materials for planarizing and/or substantially preventing permeation. In an embodiment, for example, the buffer layer 120 may include any of the following: a silicon nitride ($SiN_x$) layer, a silicon oxide ($SiO_2$) layer, and a silicon oxynitride ($SiO_xN_y$) layer. However, the buffer layer 120 is not invariably necessary and may be omitted depending on the kinds of the base layer 111 and process conditions thereof.

A switching semiconductor layer 131 and a driving semiconductor layer 132 are disposed on the buffer layer 120. In an embodiment, the switching semiconductor layer 131 and the driving semiconductor layer 132 may include at least one of the following: a polycrystalline silicon layer, an amorphous silicon layer, and an oxide semiconductor, such as indium gallium zinc oxide (IGZO) and indium zinc tin oxide (IZTO). For example, in the case in which the driving semiconductor layer 132 illustrated in FIG. 5 includes a polycrystalline silicon layer, the driving semiconductor layer 132 includes a channel area which is not doped with impurities and p+ doped source and drain areas which are formed on opposite sides of the channel area. In such an exemplary embodiment, p-type impurities, such as boron (B), may be used as dopant ions, and $B_2H_6$ is typically used. Such impurities may vary depending on the kinds of thin film transistors.

The driving thin film transistor 20 according to an exemplary embodiment employs a p-channel metal oxide semiconductor (PMOS) thin film transistor including p-type impurities, but exemplary embodiments are not limited thereto. Alternatively, the driving thin film transistor 20 may employ an n-channel metal oxide semiconductor (NMOS) thin film transistor or a complementary metal oxide semiconductor (CMOS) thin film transistor.

A gate insulating layer 140 is disposed on the switching semiconductor layer 131 and the driving semiconductor layer 132. In an embodiment, the gate insulating layer 140 may include at least one of: tetraethylorthosilicate (TEOS), silicon nitride ($SiN_x$) and silicon oxide ($SiO_2$). In an embodiment, for example, the gate insulating layer 140 may have a double-layer structure in which a $SiN_x$ layer having a thickness of about 40 nm and a TEOS layer having a thickness of about 80 nm are sequentially stacked.

A gate wiring which includes gate electrodes 152 and 155 is disposed on the gate insulating layer 140. The gate wiring further includes the gate line 151, a first capacitor plate 158, and other lines. In addition, the gate electrodes 152 and 155 are disposed so as to overlap at least a part of or the entirety of the semiconductor layers 131 and 132, for example, a channel area thereof. The gate electrodes 152 and 155 serve to substantially prevent the channel area from being doped with impurities when a source area 136 and a drain area 137 of the semiconductor layers 131 and 132 are doped with impurities during the process of forming the semiconductor layers 131 and 132.

In an embodiment, the gate electrodes 152 and 155 and the first capacitor plate 158 are disposed on a substantially same layer and include a substantially same metal material. In an embodiment, the gate electrodes 152 and 155 and the first capacitor plate 158 may include at least one of molybdenum (Mo), chromium (Cr) and tungsten (W).

An insulating interlayer 160 is disposed on the gate insulating layer 140 so as to cover the gate electrodes 152 and 155. The insulating interlayer 160, similar to the gate insulating layer 140, may include or be formed of silicon nitride (SiNx), silicon oxide (SiOx), tetraethoxysilane (TEOS), or the like, but exemplary embodiments are not limited thereto.

A data wiring which includes source electrodes 173 and 176 and drain electrodes 174 and 177 is disposed on the insulating interlayer 160. The data wiring further includes the data line 171, the common power line 172, a second capacitor plate 178, and other lines. In addition, the source electrodes 173 and 176 and the drain electrodes 174 and 177 are connected to the source area 136 and the drain area 137 of the semiconductor layers 131 and 132, respectively, through a contact hole defined at the gate insulating layer 140 and the insulating interlayer 160.

As such, the switching thin film transistor 10 includes the switching semiconductor layer 131, the switching gate electrode 152, the switching source electrode 173, and the switching drain electrode 174, and the driving thin film transistor 20 includes the driving semiconductor layer 132, the driving gate electrode 155, the driving source electrode 176, and the driving drain electrode 177. However, structures of the thin film transistors 10 and 20 are not limited thereto, and thus may be modified in various structures that are easily conceived by those skilled in the pertinent art.

The capacitor 80 includes the first capacitor plate 158 and the second capacitor plate 178 with the insulating interlayer 160 interposed therebetween.

The switching thin film transistor 10 may function as a switching element to select pixels to perform light emission.

The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving thin film transistor 20 applies, to the pixel electrode 211, a driving power which allows the light emitting layer 212 of the light emitting layer 210 in the selected pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode 211 of the light emitting layer 210 through a contact hole.

With the aforementioned structure, the switching thin film transistor 10 is driven by a gate voltage applied to the gate line 151 and serves to transmit a data voltage applied to the data line 171 to the driving thin film transistor 20. A voltage equivalent to a difference between a common voltage applied to the driving thin film transistor 20 from the common power line 172 and the data voltage transmitted from the switching thin film transistor 10 is stored in the capacitor 80 and a current corresponding to the voltage stored in the capacitor 80 flows to the light emitting layer 210 through the driving thin film transistor 20, such that the light emitting layer 210 may emit light.

A planarization layer 165 covers the data wiring, e.g., the data line 171, the common power line 172, the source electrodes 173 and 176, the drain electrodes 174 and 177 and the second capacitor plate 178, which are patterned using a single mask. The planarization layer 165 is positioned on the insulating interlayer 160.

The planarization layer 165 provides a planar surface so as to increase luminous efficiency of a light emitting element to be disposed thereon. In an embodiment, the planarization layer 165 may include at least one of the following materials: a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The pixel electrode 211 of the light emitting layer 210 is disposed on the planarization layer 165. The pixel electrode 211 is connected to the drain electrode 177 through a contact hole defined at the planarization layer 165.

A part of or the entirety of the pixel electrode 211 is disposed in a transmissive area (or a light emitting area) of the pixel PX. That is, the pixel electrode 211 is disposed corresponding to the transmissive area of the pixel defined by a pixel defining layer 190. In an embodiment, the pixel defining layer 190 may include a resin such as a polyacrylate resin and a polyimide resin.

The light emitting layer 212 is disposed on the pixel electrode 211 in the transmissive area, and the common electrode 213 is disposed on the pixel defining layer 190 and the light emitting layer 212.

The light emitting layer 212 includes a low molecular organic material or a high molecular organic material. At least one of a hole injection layer HIL and a hole transport layer HTL may further be disposed between the pixel electrode 211 and the light emitting layer 212, and at least one of an electron transport layer ETL and an electron injection layer EIL may further be disposed between the light emitting layer 212 and the common electrode 213.

The pixel electrode 211 and the common electrode 213 may be formed as one of a transmissive electrode, a transflective electrode, and a reflective electrode.

In an embodiment, transparent conductive oxide ("TCO") may be used to form a transmissive electrode. In an embodiment, such TCO may include at least one selected from the group consisting of: indium tin oxide (ITO), indium zinc oxide (IZO), antimony tin oxide (ATO), aluminum zinc oxide (AZO), zinc oxide (ZnO), and mixtures thereof.

A metal, e.g., magnesium (Mg), silver (Ag), gold (Au), calcium (Ca), lithium (Li), chromium (Cr), aluminum (Al), copper (Cu), or an alloy thereof may be used to form a transflective electrode and a reflective electrode. In such an exemplary embodiment, whether an electrode is a transflective type or a reflective type depends on the thickness of the electrode. Typically, the transflective electrode has a thickness of about 200 nm or less, and the reflective electrode has a thickness of about 300 nm or more. As the thickness of the transflective electrode decreases, light transmittance and resistance increase. On the contrary, as the thickness of the transflective electrode increases, light transmittance decreases.

In an embodiment, the transflective electrode and the reflective electrode may have a multilayer structure which includes a metal layer including a metal or a metal alloy and a TCO layer stacked on the metal layer.

In an embodiment, the pixel PX may have a double-sided emission type structure capable of emitting light in the direction of the pixel electrode 211 and the common electrode 213. In such an exemplary embodiment, both the pixel electrode 211 and the common electrode 213 may be formed as a transmissive electrode or a semi-transmissive electrode.

A sealing member 250 is disposed on the common electrode 213. In an embodiment, the sealing member 250 may include a transparent insulating substrate including a glass or a transparent plastic. In addition, the sealing member 250 may have a thin film encapsulation structure including one or more inorganic layers and one or more organic layers. In such an exemplary embodiment, the one or more inorganic layers and the one or more organic layers may be stacked alternately.

Figure 6:
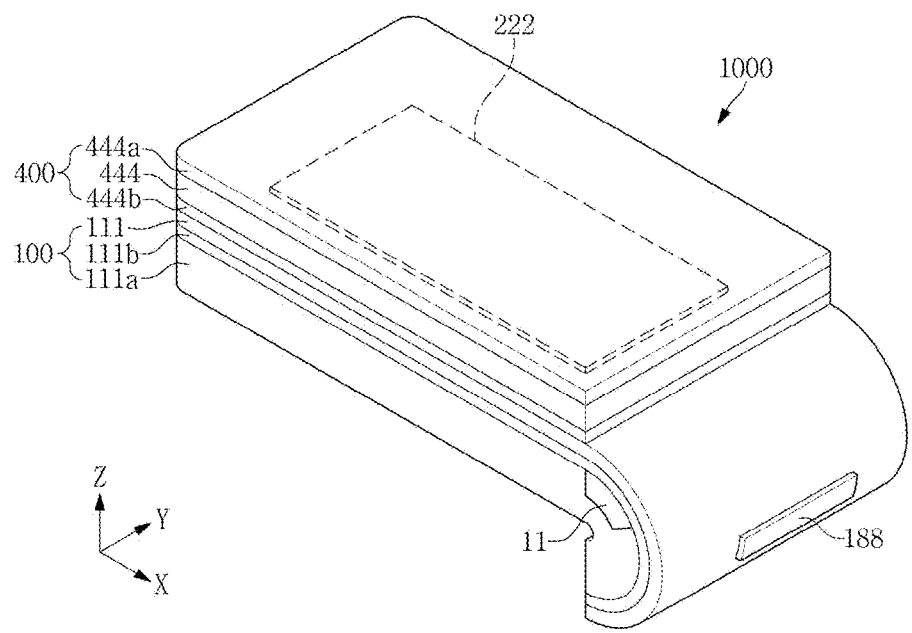
FIG. 6 is a view illustrating a state in which the display device of FIG. 1 is bent.

FIG. 6 is a view illustrating a state in which the display device of FIG. 1 is bent.

As illustrated in FIG. 6, the display device 1000 is bendable. That is, the display device 1000 may have a bent shape with respect to the groove 11 in the first protective layer 111a.

FIGS. 7 to 18 are views for explaining a method of manufacturing a display device, according to an exemplary embodiment.

Figure 7:
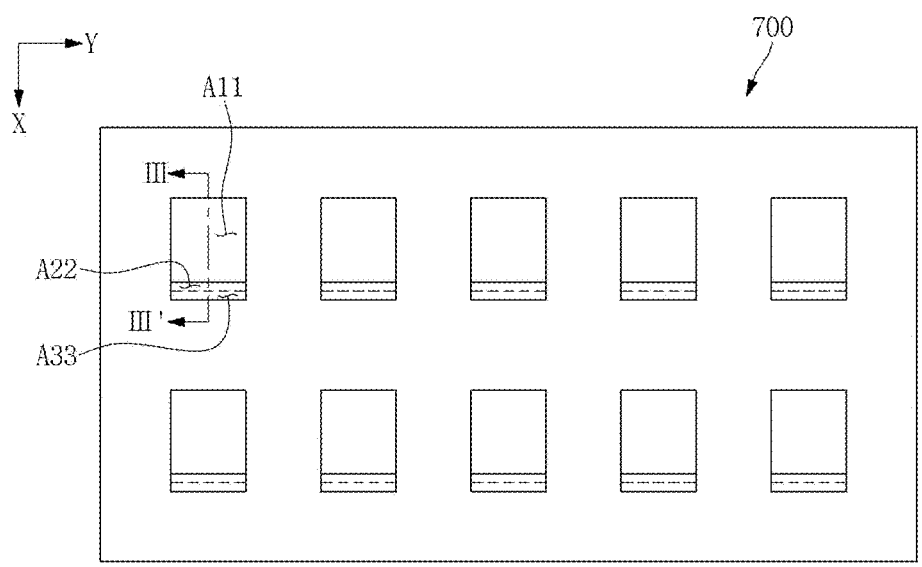
FIGS. 7 to 18 are views for explaining a method of manufacturing a display device, according to an exemplary embodiment.
Figure 8:
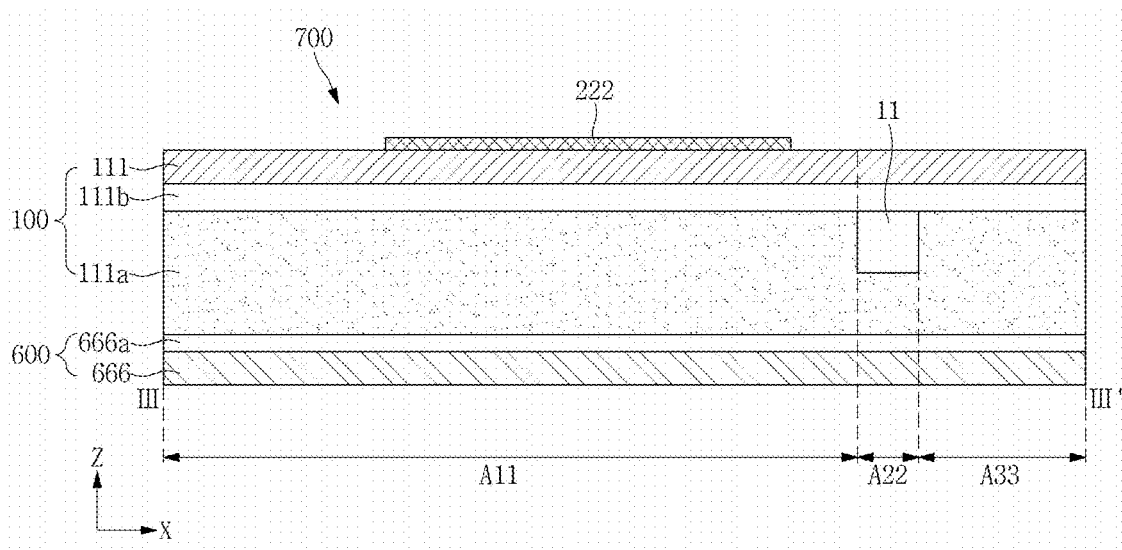

First, a mother panel 700 illustrated in FIGS. 7 and 8 is prepared. FIG. 8 is a cross-sectional view taken along the line III-III' of FIG. 7.

Although a plurality of first areas A11, a plurality of second areas A22, and a plurality of third areas A33 are depicted on the mother panel 700 of FIG. 7 for the purpose of description, the first area A11, the second area A22, and the third area A33 may not be presented on the mother panel 700 in practice.

The first area A11, the second area A22, and the third area A33 of the mother panel 700 that are adjacent to each other correspond to the first area A1, the second area A2, and the third area A3 of the display device 1000 of FIG. 1. The first area A11 of the mother panel 700 may be larger than the first area A1 of the aforementioned display device 1000, the second area A22 of the mother panel 700 may be larger than the second area A2 of the aforementioned display device 1000, and the third area A33 of the mother panel 700 may be larger than the third area A3 of the aforementioned display device 1000.

The mother panel 700 includes a carrier layer 600, a substrate 100, and a display layer 222, as illustrated in FIG. 8.

The carrier layer 600 includes an adhesive layer 666a (herein, a third adhesive layer) and a protective layer 666 (herein, a third protective layer) located below the substrate 100. The third adhesive layer 666a is positioned between the third protective layer 666 and the first protective layer 111a.

Figure 9:
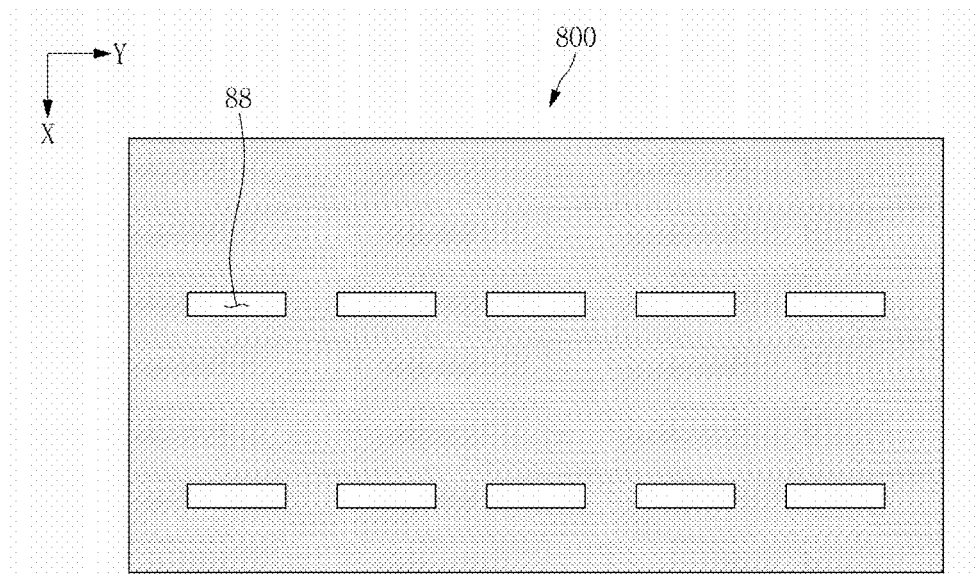

Thereafter, a mother polarizer 800 illustrated in FIG. 9 is prepared. The mother polarizer 800 has a plurality of holes 88. In an embodiment, the holes 88 may each have a quadrangular shape. In such an exemplary embodiment, in order to substantially prevent overlapping of the second area A2 and the third area A3 with the polarizer 400 which may be caused by an alignment error between the mother polarizer 800 and the mother panel 700, the hole 88 of the mother polarizer 800 may have a size larger than a size of the second area A22 of the mother panel 700.

Figure 10:
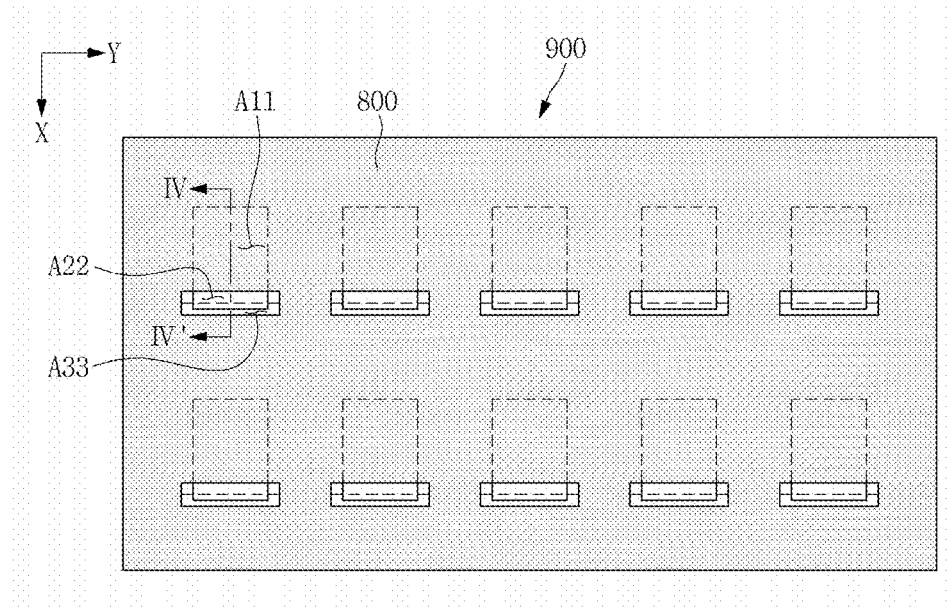
Figure 11:
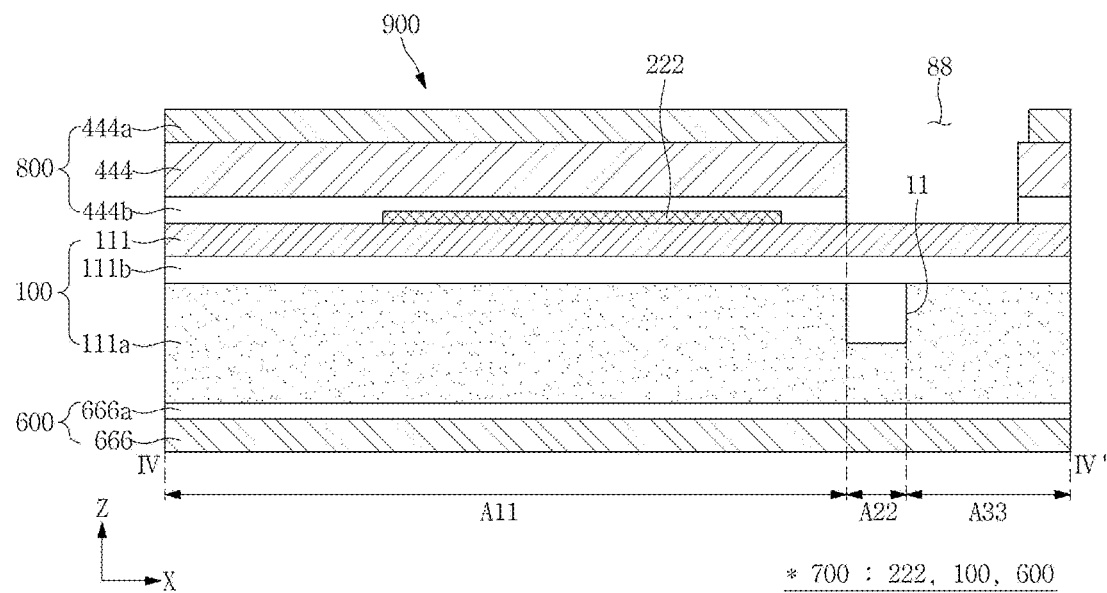

Then, as illustrated in FIGS. 10 and 11, the mother polarizer 800 is attached to the mother panel 700. FIG. 11 is a cross-sectional view taken along the line IV-IV' of FIG. 10. In an embodiment, the mother polarizer 800 includes the second adhesive layer 444b, the polarization layer 444 and the second protective layer 444a. In such an exemplary embodiment, the mother polarizer 800 is attached to the mother panel 700 through the second adhesive layer 444b. Herein, a structure in which the mother panel 700 and the mother polarizer 800 are joined with (e.g., attached to) each other is defined as a mother joined panel 900.

Figure 12:
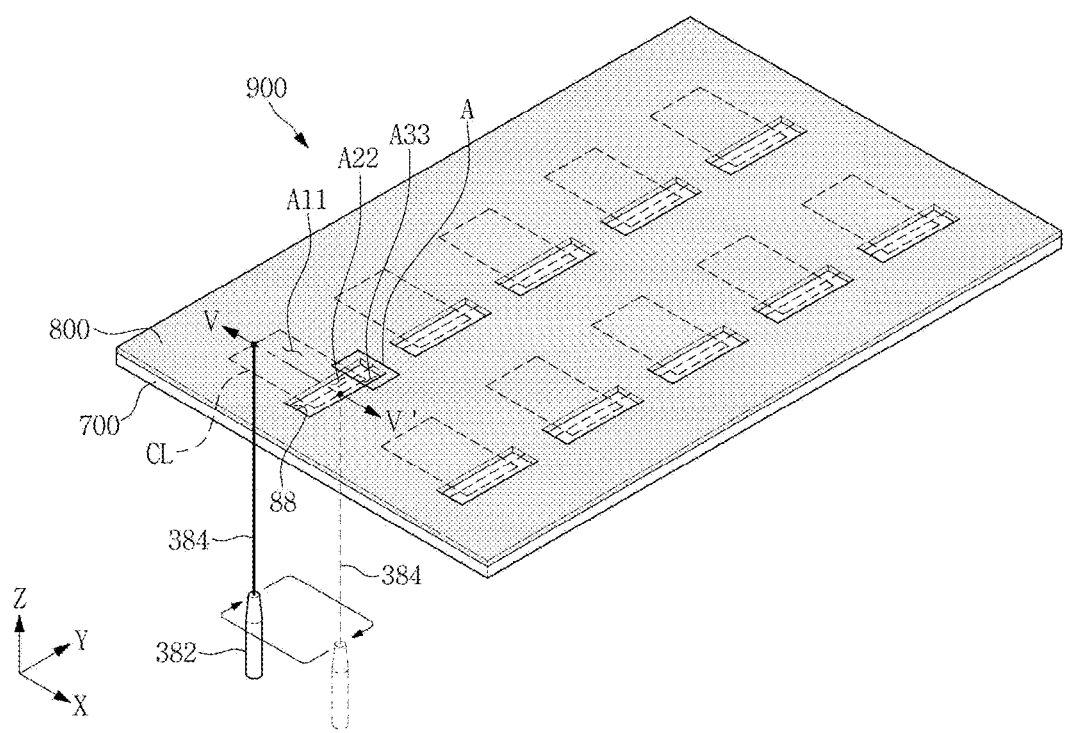

Next, as illustrated in FIG. 12, a dividing process for dividing the mother joined panel 900 into a plurality of unit panels is performed. To this end, the mother joined panel 900 is severed by a laser beam 384 irradiated from a laser apparatus 382. In an embodiment, an ultraviolet (UV) picosecond laser apparatus may be used as the laser apparatus 382.

The laser beam 384 is irradiated in the Z-axis direction from below the mother joined panel 900 to the mother joined panel 900, as illustrated in FIG. 12. Accordingly, the laser beam 384 irradiated to the mother joined panel 900 passes through the mother panel 700 first, and then passes through the mother polarizer 800.

As illustrated in FIG. 12, the laser beam 384 irradiated to the mother joined panel 900 moves along a cutting line CL which has a closed loop shape surrounding the first area A11, the second area A22, and the third area A33 that are adjacent to each other, whereby a portion surrounded by the cutting line CL is separated from the mother joined panel 900. Herein, the portion separated from the mother joined panel 900 is defined as a unit panel.

Figure 13:
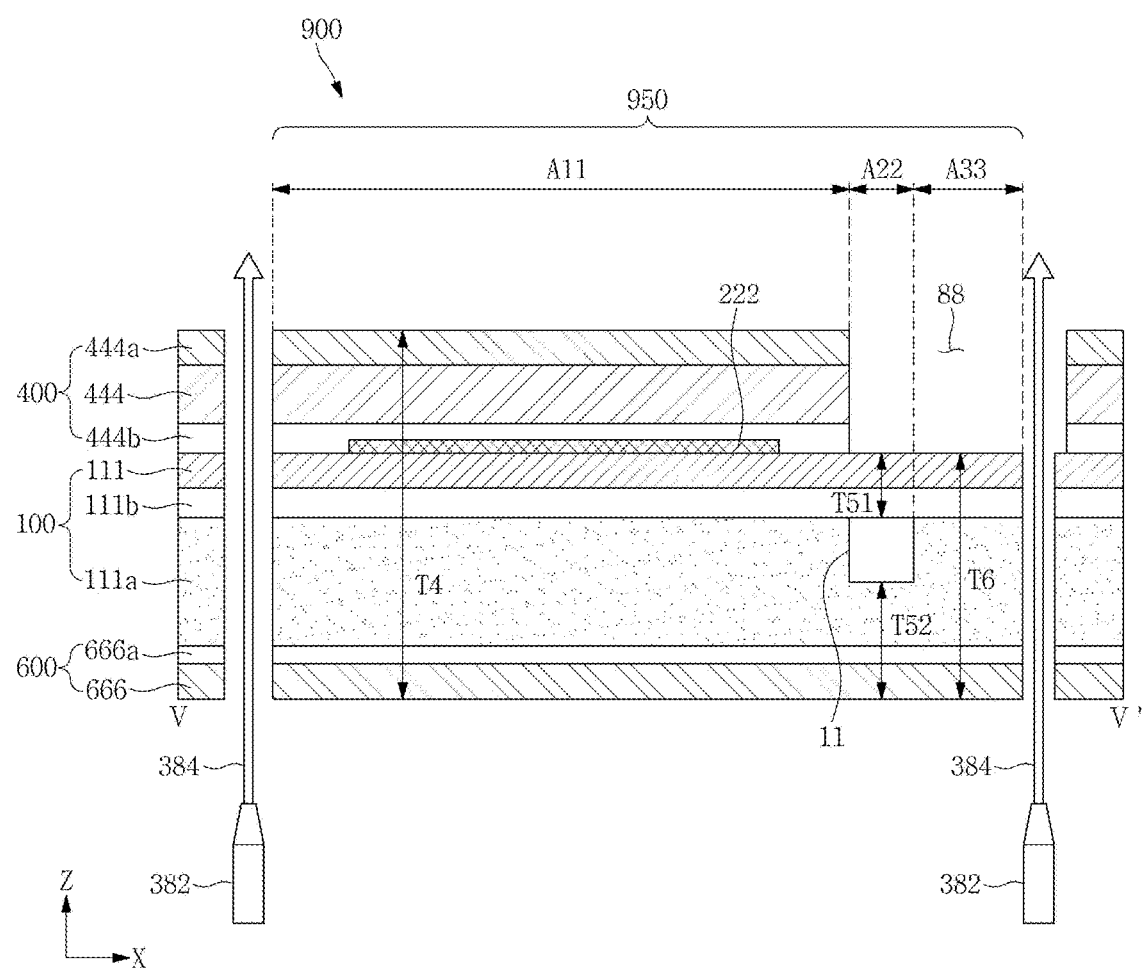

By such a dividing process, a plurality of unit panels 950 (see FIG. 13) are obtained from one mother joined panel 900. FIG. 13 is a cross-sectional view taken along the line V-V' of FIG. 12.

Referring to FIG. 13, the mother joined panel 900 may have a fourth thickness T4 at the first area A11, a fifth thickness T51+T52 at the second area A22, and a sixth thickness T6 at the third area A33. In an embodiment, the fourth, fifth, and sixth thicknesses T4, T51+T52, and T6 have different values. Specifically, the mother joined panel 900 has the fourth thickness T4 including the substrate 100, the polarizer 400, and the carrier layer 600 at the first area A11, has the fifth thickness T51+T52 including the substrate 100 having the groove 11 and the carrier layer 600 at the second area A22, and has the sixth thickness T6 including the substrate 100 and the carrier layer 600 at the third area A33. Accordingly, the fourth thickness T4 may be larger than the fifth and sixth thicknesses T51+T52 and T6, and the fifth thickness T51+T52 may be less than the sixth thickness T6. Accordingly, an intensity of the laser beam for dividing the mother joined panel 900 may be different at the first area A11, the second area A22, and the third area A33, which will be described in further detail below with reference to FIGS. 14, 15, 16, 17, and 18.

FIGS. 14, 15, 16, 17, and 18 are enlarged views of a region "A" of FIG. 12, and a dividing step of the mother joined panel 900 illustrated in FIGS. 12 and 13 will be described below in further detail with reference to FIGS. 14, 15, 16, 17, and 18.

Figure 14:
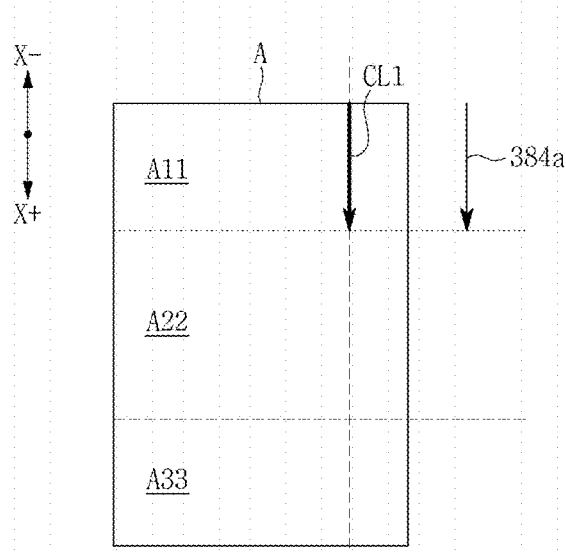

A first laser beam 384a may be irradiated in an X+ direction along a first cutting line CL1 located at the first area A11 of the mother joined panel 900, as illustrated in FIG. 14. For example, the first laser beam 384a may be irradiated in the X+ direction along the first cutting line CL1 which extends in the first area A11 to a boundary between the first area A11 and the second area A22. In such an exemplary embodiment, the first laser beam 384a may be irradiated to the mother joined panel 900 with an output optimized for cutting the mother joined panel 900 having the fourth thickness T4. In an embodiment, for example, the first laser beam 384a may be irradiated to the mother joined panel 900 at an output in a range from about 7 W to about 13 W. Accordingly, the mother joined panel 900 is cut along the first cutting line CL1 of the first area A11.

Figure 15:
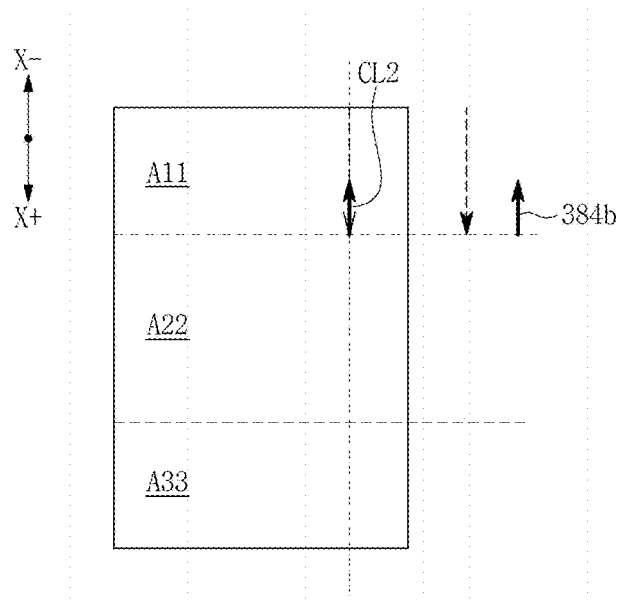

Next, a second laser beam 384b may be irradiated in an X- direction along a second cutting line CL2 located at the first area A11 of the mother joined panel 900, as illustrated in FIG. 15. For example, the second laser beam 384b may be irradiated in the X- direction along the second cutting line CL2 which extends from the boundary between the first area A11 and the second area A22 to the first area A11. The second cutting line CL2 may overlap with the first cutting line CL1 and a third cutting line CL3. In such an exemplary embodiment, the second laser beam 384b is a laser beam which is irradiated while an output optimized for cutting the mother joined panel 900 having the fourth thickness T4 is changed to an output optimized for cutting the mother joined panel 900 having the fifth thickness T51+T52, and the second laser beam 384b may be irradiated to the mother joined panel 900 with an output which is less than the output optimized for cutting the mother joined panel 900 having the fourth thickness T4 and greater than the output optimized for cutting the mother joined panel 900 having the fifth thickness T51+T52. That is, the second laser beam 384b may have an intensity less than that of the first laser beam 384a and greater than that of a third laser beam 384c. In an embodiment, for example, the second laser beam 384b may be irradiated at an output in a range from about 2 W to about 13 W. Accordingly, the second laser beam 384b which has an intensity less than that of the first laser beam 384a is irradiated to the mother joined panel 900 which is cut by the first laser beam 384a, such that carbonization of the mother joined panel 900 is substantially minimized to prevent or substantially prevent damage to the display device.

Figure 16:
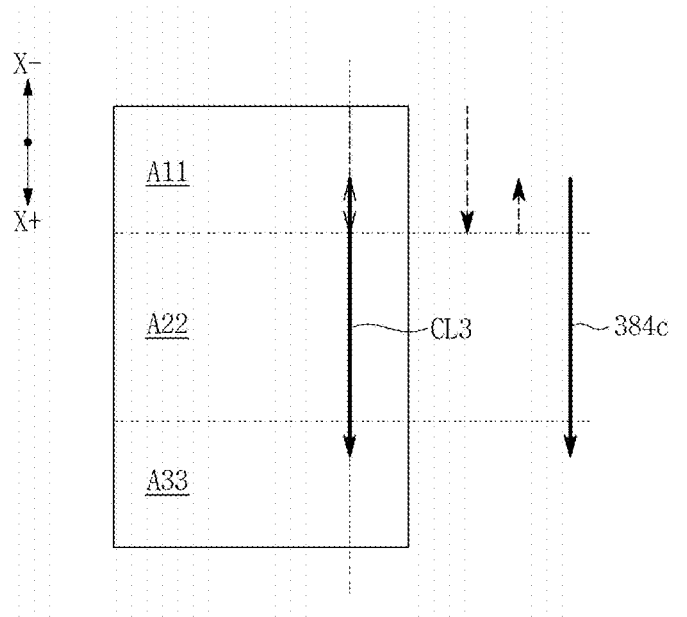

Next, the third laser beam 384c may be irradiated in the X+ direction along the third cutting line CL3 located at the first area A11, the second area A22, and the third area A33 of the mother joined panel 900, as illustrated in FIG. 16. For example, the third laser beam 384c may be irradiated in the X+ direction along the third cutting line CL3 which extends from the first area A11 to the second area A22 and the third area A33. At least a part of the third cutting line CL3 may overlap with the first cutting line CL1 and the second cutting line CL2 at the first area A11, and another part of the third cutting line CL3 may overlap with a fourth cutting line CL4 and a fifth cutting line CL5 at the third area A33. In such an exemplary embodiment, the third laser beam 384c may be irradiated to the mother joined panel 900 with an output optimized for cutting the mother joined panel 900 having the fifth thickness T51+T52. In an embodiment, for example, the third laser beam 384c may be irradiated to the mother joined panel 900 at an output in a range from about 2 W to about 4 W. In such an exemplary embodiment, the first area A11 of the mother joined panel 900 having the fourth thickness T4 has been already cut, thus substantially minimizing damage of the display device, the second area A22 of the mother joined panel 900 having the fifth thickness T51+T52 is cut along the third cutting line CL3, and the third area A33 of the mother joined panel 900 having the sixth thickness T6 which is larger than the fifth thickness T51+T52 is not cut.

Figure 17:
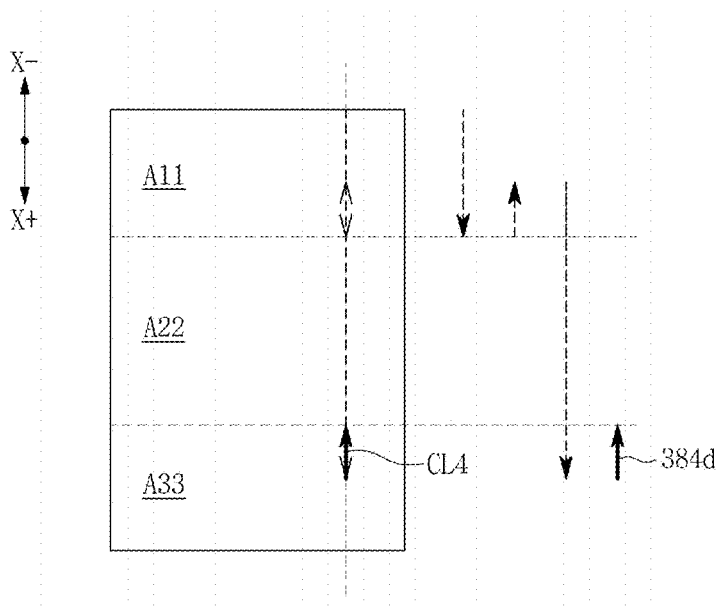

Next, a fourth laser beam 384d may be irradiated in the X− direction along the fourth cutting line CL4 located at the third area A33 of the mother joined panel 900, as illustrated in FIG. 17. For example, the fourth laser beam 384d may be irradiated in the X− direction along the fourth cutting line CL4 which extends from the third area A33 to a boundary between the second area A22 and the third area A33. The fourth cutting line CL4 may overlap with the third cutting line CL3 and the fifth cutting line CL5 at the third area A33. In such an exemplary embodiment, the fourth laser beam 384d is a laser beam which is irradiated while an output optimized for cutting the mother joined panel 900 having the fifth thickness T51+T52 is changed to an output optimized for cutting the mother joined panel 900 having the sixth thickness T6, and the fourth laser beam 384d may be irradiated to the mother joined panel 900 with an output which is greater than the output optimized for cutting the mother joined panel 900 having the fifth thickness T51+T52 and less than an output optimized for cutting the mother joined panel 900 having the sixth thickness T6. That is, the fourth laser beam 384d may have an intensity greater than that of the third laser beam 384c and less than that of a fifth laser beam 384e. In an embodiment, for example, the fourth laser beam 384d may be irradiated at an output in a range from about 2 W to about 10 W. Accordingly, the fourth laser beam 384d having an intensity less than that of the fifth laser beam 384e is irradiated to the mother joined panel 900 at the third area A33 which has the sixth thickness T6 larger than the fifth thickness T51+T52, such that carbonization of the mother joined panel 900 is substantially minimized to prevent or substantially prevent damage to the display device.

Figure 18:
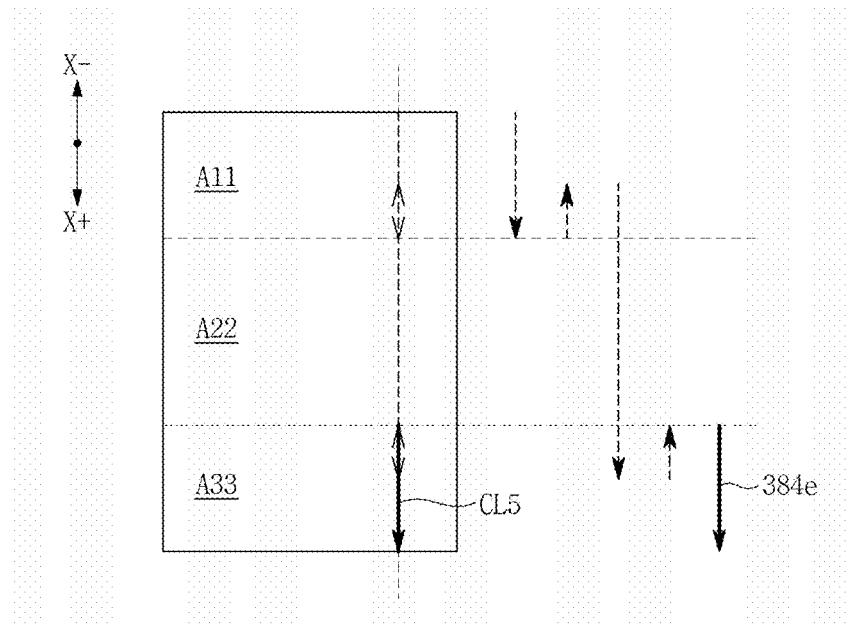

Lastly, the fifth laser beam 384e may be irradiated in the X+ direction along the fifth cutting line CL5 located at the third area A33 of the mother joined panel 900, as illustrated in FIG. 18. For example, the fifth laser beam 384e may be irradiated in the X+ direction along the fifth cutting line CL5 which extends from the boundary between the second area A22 and the third area A33 to the third area A33. At least a part of the fifth cutting line CL5 may overlap with the third cutting line CL3 and the fourth cutting line CL4 at the third area A33. In such an exemplary embodiment, the fifth laser beam 384e may be irradiated to the mother joined panel 900 with an output optimized for cutting the mother joined panel 900 having the sixth thickness T6. In an embodiment, for example, the fifth laser beam 384e may be irradiated to the mother joined panel 900 at an output in a range from about 4 W to about 10 W. Accordingly, the third area A33 of the mother joined panel 900 is cut along the fifth cutting line CL5.

According to an exemplary embodiment, carbonization of display devices caused by a laser beam which is irradiated during the time when the output of the laser beam is changed may be substantially minimized through the cutting process of the mother joining panel 900 described above.

Then, although not illustrated, the carrier layer 600 is separated from the unit panel 950. Specifically, the third protective layer 666 and the third adhesive layer 666a are removed from the unit panel 950.

Next, although not illustrated, the driver 188 is mounted at the third area A33 of the unit panel 950.

Through such a process, the unit panel 950 may have the structure of the display device 1000 illustrated in FIG. 1.

In an embodiment, although not illustrated, a unit polarizer may be used instead of the above-described mother polarizer 800. In such an exemplary embodiment, the cutting process is performed for the mother panel 700 without the mother polarizer 800 in FIG. 12. In other words, the dividing process for the mother panel 700 illustrated in FIG. 10 is performed. This dividing step is substantially the same as the laser cutting process of FIG. 12 described above. In such an exemplary embodiment, however, since the mother polarizer 800 is not attached to the mother panel 700, the mother panel 700 at the first area A11 has a thickness substantially equal to a thickness of the mother panel 700 at the second area A22. In an exemplary embodiment, a touch screen panel (not illustrated) may be used as the functional member in place of the polarizer 400 described above. In another embodiment, both the polarizer 400 and the touch screen panel may be used as the functional member. In such an exemplary embodiment, the touch screen panel may be located on the polarizer 400.

Figure 19:
FIG. 19 is a view illustrating effects of the display device according to an exemplary embodiment.

FIG. 19 is a view illustrating the effects of the display device according to an exemplary embodiment, with an upper portion cut through a conventional cutting process and a lower portion cut through the cutting process according to an exemplary embodiment of the present invention.

In the upper portion, which is formed by the conventional cutting process, an inclination of a horizontal direction with respect to a vertical direction is not relatively large, and a protruding portion is formed in a curved shape. A display panel having such a curved shape is formed when an output of a laser beam changes gradually at boundaries of areas having different thicknesses, and the display panel may be carbonized to damage the display device.

On the other hand, in the lower portion which is formed by the cutting process according to an exemplary embodiment of the present invention, an inclination of a horizontal direction with respect to a vertical direction is relatively large, and a protruding portion is formed in a step shape. A display panel having such a step shape is formed when a laser beam that is optimized for each thickness is applied at boundaries of areas having different thicknesses, and thus carbonization in the display panel may be substantially prevented.

The manufacturing method according to an exemplary embodiment may be also applied to LCD devices or electrophoretic display devices. That is, LCD devices or electrophoretic display devices which include a polarizer or a touch screen panel in a selective manner at a non-pad area (i.e. the first area) as described above may be processed by laser beams having different intensities.

As set forth herein, a display device and a method of manufacturing the display device may provide the following effects.

According to one or more exemplary embodiments, in a laser process for the display device or a cutting process for a mother panel, a laser beam having an intensity optimized for each thickness is irradiated to areas of the display device and the mother panel that have different thicknesses. Accordingly, a substrate may be easily cut in a non-pad area, and carbonization and damage of the substrate may be substantially minimized in a pad area.

While the present invention has been illustrated and described with reference to some exemplary embodiments thereof, it will be apparent to those of ordinary skill in the art that various changes in form and detail may be made thereto without departing from the spirit and scope of the present invention.

What is claimed is:

1. A method of manufacturing a display device, the method comprising:
   preparing a mother substrate including a first area and a second area which are sequentially located along a first direction;
   forming a display layer at the first area of the mother substrate;
   forming a functional member at the first area so as to overlap with the display layer;
   irradiating a first laser beam in the first direction along a first cutting line of the first area;
   irradiating a second laser beam in a second direction which is from the second area toward the first area along a second cutting line of the first area; and
   irradiating a third laser beam in the first direction at the first area and the second area along a third cutting line of the first area and the second area,
   wherein the first laser beam has an intensity greater than an intensity of the second laser beam and an intensity of the third laser beam,
   wherein the intensity of the second laser beam is greater than the intensity of the third laser beam, and
   wherein the second cutting line overlaps with at least a part of the first cutting line and at least a part of the third cutting line at the first area.

2. The method of claim 1, wherein the display device has a first thickness at the first area and a second thickness which is less than the first thickness at the second area.

3. The method of claim 1, wherein the first cutting line overlaps with at least a part of the third cutting line at the first area.

4. The method of claim 1,
   wherein the mother substrate further includes a third area,
   wherein the method further comprises, after irradiating the third laser beam in the first direction at the first area, the second area, and the third area along the third cutting line of the first area, the second area, and the third area:
   irradiating a fourth laser beam in the second direction at the third area along a fourth cutting line of the third area; and
   irradiating a fifth laser beam in the first direction at the third area along a fifth cutting line of the third area,
   wherein the fourth laser beam has an intensity greater than an intensity of the third laser beam and less than an intensity of the fifth laser beam,
   wherein the fifth laser beam has an intensity greater than the intensities of the second laser beam and the fourth laser beam, and
   wherein the fourth cutting line overlaps with at least a part of the third cutting line and at least a part of the fifth cutting line.

5. The method of claim 4, wherein the display device has a first thickness at the first area, a second thickness which is less than the first thickness at the second area, and a third thickness which is less than the first thickness and larger than the second thickness at the third area.

6. The method of claim 4, wherein at least a part of the first cutting line overlaps with at least a part of the second cutting line and at least a part of the third cutting line at the first area.

7. The method of claim 4, wherein at least a part of the third cutting line overlaps with the first cutting line at the first area, and another part of the third cutting line overlaps with the fifth cutting line at the third area.

8. The method of claim 4, wherein the mother substrate has a groove at the second area.

* * * * *